United States Patent
Eroz et al.

(10) Patent No.: US 7,581,162 B2
(45) Date of Patent: Aug. 25, 2009

(54) SYSTEM, METHOD AND COMPUTER PROGRAM PRODUCT FOR IMPLEMENTING RATE ¾ LOW DENSITY PARITY CHECK CODE

(75) Inventors: Mustafa Eroz, Germantown, MD (US); Lakshmi Iyer, Germantown, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 645 days.

(21) Appl. No.: 11/432,576

(22) Filed: May 11, 2006

(65) Prior Publication Data
US 2007/0101233 A1    May 3, 2007

Related U.S. Application Data

(60) Provisional application No. 60/726,868, filed on Oct. 14, 2005.

(51) Int. Cl.
*G06F 11/00* (2006.01)
(52) U.S. Cl. .................................................... 714/800
(58) Field of Classification Search ......... 714/600–801, 714/807
See application file for complete search history.

(56) References Cited

U.S. PATENT DOCUMENTS

| | | | | |
|---|---|---|---|---|
| 7,020,829 | B2 | 3/2006 | Eroz et al. | 714/794 |
| 7,191,378 | B2 | 3/2007 | Eroz et al. | 714/758 |
| 7,243,287 | B2 * | 7/2007 | Cameron et al. | 714/752 |
| 7,516,390 | B2 * | 4/2009 | Shen et al. | 714/755 |
| 2004/0019845 | A1 | 1/2004 | Eroz et al. | 714/801 |
| 2006/0242534 | A1 * | 10/2006 | Livshitz | 714/758 |

OTHER PUBLICATIONS

Yuan Li et al., Bit to symbol mapping in LDPC coded modulations, 2005, IEEE, p. 1-4.*

* cited by examiner

*Primary Examiner*—Shelly A Chase
(74) *Attorney, Agent, or Firm*—K&L Gates, LLP

(57) ABSTRACT

A method, system, apparatus and computer program product for correcting errors in a signal transmission using a rate ¾ low density parity check (LDPC) code. At least a portion of a received data message is encoded by using a parity check matrix of the LDPC code. The encoded data message is transmitting in a signal transmission over a communication channel to a receiving device in the communication network. After being received, the encoded portion of the data message is decoded using a parity check matrix of the LDPC code to obtain the data message. For example, the encoding and decoding can be performed using a parity check matrix corresponds to a coded block size (N) equal to 1944 for communicating data in compliance with an 802.11n standard.

21 Claims, 7 Drawing Sheets

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \equiv 0$$

FIG. 4A $$\begin{bmatrix} 0 & 0 & 0 & 0 \\ 0 & 0 & 1 & 0 \\ 0 & 1 & 0 & 0 \\ 1 & 0 & 0 & 0 \end{bmatrix} \equiv 1$$

FIG. 4B $$\begin{bmatrix} 0 & 0 & 0 & 0 \\ 0 & 0 & 0 & 0 \\ 0 & 0 & 0 & 0 \\ 0 & 0 & 0 & 0 \end{bmatrix} \equiv -$$

FIG. 4C

SYSTEM, METHOD AND COMPUTER PROGRAM PRODUCT FOR IMPLEMENTING RATE ¾ LOW DENSITY PARITY CHECK CODE

RELATED APPLICATION

This application is related to and claims benefit under §35 U.S.C. 119(e) to the earlier filing date of U.S. Provisional Patent Application Ser. No. 60/726,868 filed on Oct. 14, 2005, entitled "Rate ¾ Low Density Parity Check Code." The contents of the Provisional Application are fully incorporated herein by reference.

FIELD OF THE INVENTION

The present invention relates generally to the use of low density parity check (LDPC) codes for error correction of data transmissions in communication systems.

BACKGROUND OF THE INVENTION

Communication systems employ coding to ensure reliable communication across noisy communication channels. It is possible to construct error-correcting codes in which the likelihood of failure is arbitrarily low. This coding technique requires adding increasing amounts of redundant data to the original data message. Shannon's theorem sets an upper bound to the error correction rate that can be achieved and, thus, the level of noise that can be tolerated using a fixed amount of redundancy (i.e., Shannon limit). However, this theorem does not tell designers how to construct such an optimal apparatus or system.

As a result, coding design has focused on achieving rates approaching the Shannon limit. One such class of codes that approach the Shannon limit is Low Density Parity Check (LDPC) codes. Traditionally, LDPC codes have not been widely deployed because of a number of drawbacks. One drawback is that LDPC encoding techniques are highly complex. Another drawback is that encoding an LDPC code using a generator matrix requires storing a very large, non-sparse matrix. Additionally, LDPC codes require large blocks to be effective; consequently, even though parity check matrices of LDPC codes are sparse, storing these matrices is problematic. Moreover, recent changes in wireless communications present additional challenges for coding design.

Recently, a new 802.11 Task Group (TGn) was formed to develop amendments to the 802.11 standard for local-area wireless networks. New wireless standards are expected to enable real data throughput estimated to reach a theoretical 540 Mbit/s. This will require even higher raw data rates at the physical layer, and may be up to 40 times faster than 802.11b, and near 10 times faster than 802.11a or 802.11g. Accordingly, coding design for error correction has become even more challenging for communication systems operating at higher data rates and in conformance with newly adopted wireless standards.

Therefore, there is a need in the art for an LDPC communication system that employs simple encoding and decoding techniques. There is also a need for using LDPC codes efficiently to support high data rates, without introducing greater complexity. Additionally, there is a need to improve performance of LDPC encoders and decoders, while minimizing storage requirements for implementing LDPC coding.

The needs presented above as well as other needs are addressed by the present invention.

SUMMARY OF THE INVENTION

According to an embodiment of the present invention, a method for correcting errors in a signal transmission using a rate ¾ low density parity check (LDPC) code is disclosed. In this embodiment, at least a portion of a received data message is encoded by using a parity check matrix of rate ¾ LDPC code. The encoded data message is transmitted in a signal transmission over a communication channel to a receiving device in the communication network. After being received, the encoded portion of the data message is decoded using a parity check matrix of rate ¾ LDPC code to obtain the data message.

In a preferred embodiment of the invention, the encoding and decoding are performed using a parity check matrix corresponding to an N=1944, a representation of the parity check matrix being 48 29 28 39 9 61 - - - 63 45 80 - - - 37 32 22 1 0 - - - - 4 49
    42 48 11 30 - - - 49 17 41 37 15 - 54 - - - 0 0 - - - 35 76
    78 51 37 35 21 - 17 64 - - - 59 7 - - 32 - - 0 0 - - 9 65 44
    9 54 56 73 34 42 - - - 35 - - - 46 39 0 - - 0 0 - 3 62 7 80 68
    26 - 80 55 - 36 - 26 - 9 - 72 - - - - - 0 0 26 75 33 21 69 59
    3 38 - - - 35 - 62 36 26 - - 1 - - - - 0.

In this parity check matrix, each entry represents an 81×81 submatrix that is either a right-circularly-shifted identity submatrix, or a zero submatrix represented by a dash. In the case of the former, the value of the entry represents the number of times the columns of the identity submatrix are circularly-shifted to the right. The encoding of the data message can be performed in an encoder integral with a transmitter, and the decoding of the encoded data message can be performed by a decoder integral with a receiver. In the preferred embodiment, the parity check matrix is implemented for communicating data messages in conformance with an 802.11n wireless standard. However, the parity check matrix can be implemented for communicating data messages in conformance with other wireless standards and other communication systems as well. It is also contemplated that other data processing operations can be performed on data messages before or after encoding (but prior to transmission) such as repetition shortening, punctuating or the like.

In another embodiment, a system for correcting errors in a signal transmission using a rate ¾ LDPC code is disclosed. The system includes a transmitter and a receiver that communicate data messages via a communication channel. The transmitter encodes at least a portion of a received data message using a parity check matrix of rate ¾ LDPC code. The transmitter transmits the encoded data message as a signal transmission to the receiver via the communication channel. The receiver in the network receives the signal transmission and decodes the encoded portion of the data message. The data message is decoded using a parity check matrix of the rate ¾ LDPC code. Similar to previous embodiments, each entry in the parity check matrix represents an 81×81 submatrix, wherein each entry in the parity check matrix is either a right-circularly-shifted identity submatrix, or a zero submatrix represented by a dash. In the case of the former, the value of the each entry represents the number of times the columns of the submatrix are circularly-shifted to the right. The system may also include a data processing unit for performing data processing operations on data messages before or after encoding (but prior to transmission) such as repetition, shortening, puncturing or the like.

In another embodiment, an encoding device for correcting errors in a signal transmission using a rate ¾ LDPC code is disclosed. The encoding device includes means for encoding at least a portion of a received data message using a parity check matrix of rate ¾ LDPC code. A means for transmitting at least a portion of the encoded data message in a signal transmission over a communication channel to a receiving device is also included. The encoding is performed using a parity check matrix corresponding to an N=1944. Each entry in the parity check matrix represents an 81×81 submatrix, wherein each entry is either a right-circularly-shifted identity submatrix, or a zero submatrix represented by a dash. In the case of the former, the value of the entry represents the number of times the columns of the identity submatrix are circularly-shifted to the right.

In another embodiment, a decoding device for correcting errors in a signal transmission using a rate ¾ LDPC code is disclosed. The decoding device includes means for receiving a signal transmission via a communication channel, and means for decoding an encoded portion of a data message. The decoding is performed using a parity check matrix of rate ¾ LDPC code to obtain the data message. In a preferred embodiment, the decoding is performed using a parity check matrix corresponding to an N=1944. Each entry in the parity check matrix represents an 81×81 submatrix that is either a right-circularly-shifted identity submatrix, or a zero submatrix represented by a dash. In the case of the former, the value of each entry is the number of times the columns of the identity submatrix are circularly-shifted to the right.

In yet another embodiment, a computer-program product that includes a computer-readable media storing executable instructions or code thereon for communicating data messages between a receiver and transmitter in a communication network is disclosed. The executable instructions are stored in a memory and can be executed by one or more processors for performing the encoding and decoding of a data message using a parity check matrix of rate ¾ LDPC code. Additionally, the executable instructions may also include instructions for performing data processing operations before and after encoding (but prior to transmission) such as repetition, puncturing, shortening or the like. In a preferred embodiment, the data messages are encoded and decoded for achieving a signal transmission in conformance with an 802.11n wireless standard. It is contemplated, however, that data messages can be encoded and decoded for achieving a signal transmission in conformance with other wireless standards and other communication systems.

Additional features and advantages are described herein, and will be apparent from, the following Detailed Description and the figures.

BRIEF DESCRIPTION OF THE DRAWINGS

FIG. 4A is a sample M×M identity submatrix in which there is a center diagonal of "1s" in accordance with an embodiment of the invention.

FIG. 4B is a sample M×M identity submatrix in which the columns are shifted to the right in a circular manner by 1 in accordance with an embodiment of the invention.

FIG. 4C is a sample M×M zero submatrix in accordance with an embodiment of the invention.

DETAILED DESCRIPTION OF THE PREFERRED EMBODIMENTS

In the following description, for the purposes of explanation, numerous specific details are set forth in order to provide a thorough understanding of the present invention. Known structures and devices are shown in block diagram form in order to avoid unnecessarily obscuring the present invention. Additionally, in the figures the same elements are indicated with the same element numbers.

Figure 1:
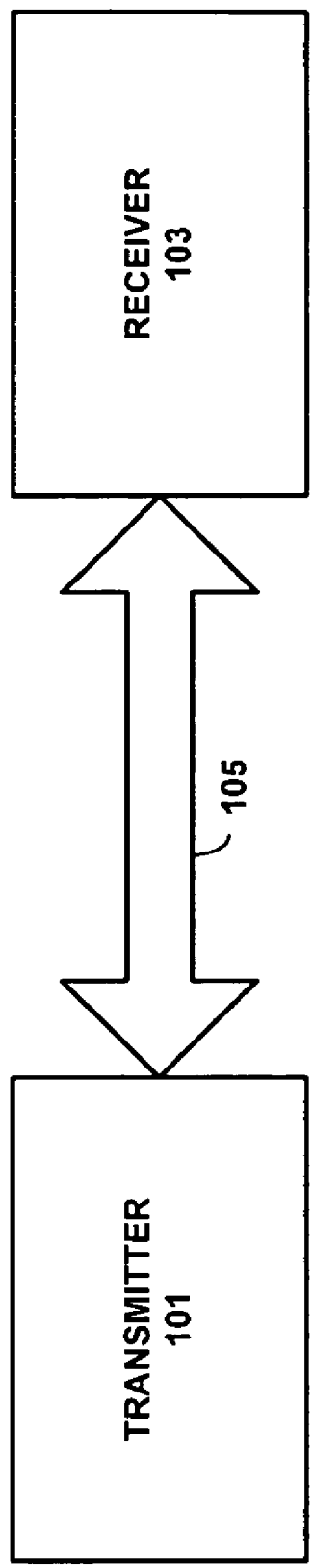
FIG. 1 is a system for correcting errors in a signal transmission using a rate ¾ low density parity check (LDPC) code in accordance with an embodiment of the invention.

FIG. 1 is a system for correcting errors in a signal transmission using a rate ¾ low density parity check (LDPC) code in accordance with an embodiment of the invention. In FIG. 1, the system includes a transmitter 101 that generates signal waveforms that are transmitted across a communication channel 105 to a receiver 103. The transmitter 101 can be any electronic device known in the art which with the aid of an antenna (not shown) propagates an electromagnetic signal or other communications across the communication channel 105 to a receiving device. The receiver 103 can also be any electronic device known in the art which with the aid of an antenna (not shown) receives a propagated electromagnetic signal or other communications from a transmitting device via the communication channel 105. As mentioned, the receiver 103 is at the receiving end of the communication channel 105 and decodes messages/information from the transmitter 101, which first encoded the messages/information prior to transmission. Both the transmitter 101 and receiver 103 implement a parity check matrix of rate ¾ LDPC code for processing data messages, which are transmitted and received in the form of a signal transmission across the communication channel 105. In a preferred embodiment, the data messages are encoded and decoded for achieving signal transmissions in conformance with an 802.11n wireless standard. It is also contemplated, however, that data messages can be encoded and decoded for achieving signal transmissions in conformance with other wireless standards and other communication systems. A more detailed discussion of the transmitter 101 and receiver 103 are presented in the discussion of FIGS. 2 and 3 that follow.

Figure 2:
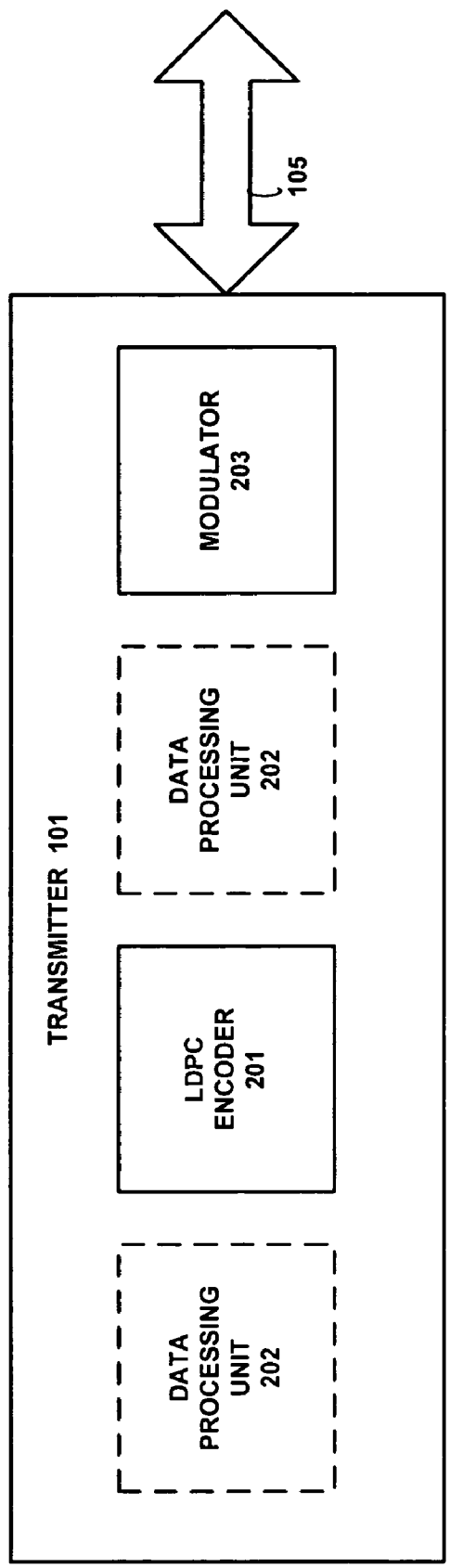
FIG. 2 is a transmitter for correcting errors in a signal transmission using a rate ¾ LDPC code in accordance with an embodiment of the invention.

FIG. 2 illustrates a transmitter for correcting errors in a signal transmission using a rate ¾ LDPC code in accordance with an embodiment of the invention. As seen in FIG. 2, the transmitter 101 is equipped with an LDPC encoder 201 that accepts input from an information source (not shown) and outputs a coded stream of higher redundancy suitable for error correction processing at the receiver 103. The LDPC encoder 201 can be any device known in the art that is capable encoding a signal (such as a bitstream) or data into a form that is acceptable for transmission over the communication channel 105 using a programmed algorithm. FIG. 2 also includes a data processing unit 202 that can be implemented before or after the LDPC encoder 201. The data processing unit 202 can be made up of a plurality of discrete logic components or implemented in software for performing data processing operations prior to or after encoding operations, e.g., shortening, puncturing, repetition or the like.

Systematic encoding of K information bits, $u_0, u_1, \ldots, u_{K-1}$ includes producing N−K parity bits $p_0, p_1, \ldots, p_{N-K-1}$ (parity bits being a function of information bits) so that N coded bits $c_0, c_1, \ldots, c_{N-1}$ are formed by concatenating K information bits and N−K parity bits (i.e., $c_0, c_1, \ldots, c_{N-1} = u_0, u_1, \ldots, u_{K-1}$ $p_0, p_1, \ldots, p_{N-K-1}$). By way of example, K=1458 information bits are systematically encoded to N=1944 coded bits using a rate ¾ LDPC coding scheme. If desired, repetition, puncturing, shortening or similar operations can be performed by the data processing unit 202 prior to transmitting coded bits. The following are examples of data processing operations that can be performed by the data processing unit 202.

Repetition: Repetition is a process that repeats the bits transmitted across a channel. In this case, certain coded bits can be repeatedly transmitted. For example, if every even indexed coded bit is repeated, then what is transmitted is ($c_0$, $c_0, c_1, c_2, c_2, c_3, c_4, c_4 \ldots, c_{N-1}$).

Puncturing: Puncturing is a process of removing bits. In this case, certain coded bits can be punctured before transmission. For example, if every third bit is punctured starting from $c_0$, then what is transmitted is ($c_1, c_2, c_4, c_5, c_7, c_8, c_{10}, \ldots$).

Shortening: Shortening is a process in which a certain number of uncoded bits can be set to 0 before encoding. Then after systematic encoding, those artificially set to 0 bits are deleted from the codeword. For example, if the first ten uncoded bits are set to 0, $u_i=0$, i=0, 1, 2 . . . , 9 then what is transmitted is $u_{10}, u_{11}, \ldots, u_{K-1} p_0, p_1, \ldots, p_{N-K-1}$). Repetition, puncturing, shortening or similar operations can be used in conjunction with, for example, a parity check matrix using a rate ¾ LDPC code.

In FIG. 2, the LDPC encoder 201 implements a parity check matrix using rate ¾ LDPC code. In a preferred embodiment, the coded block size (N) is 1944, and the data messages are encoded for achieving a signal transmission in conformance with an 802.11n wireless standard. It is also contemplated that data messages can be encoded for achieving a signal transmission in conformance with other wireless standards and other communication systems. Each entry in the parity check matrix represents an 81×81 submatrix, wherein each entry is either a right-circularly-shifted identity submatrix, or a zero submatrix. The specifications of the a parity check matrix are described in more detail in the discussion of FIGS. 4A-4C below. The encoded data messages are then forwarded to the modulator 203, which maps the encoded messages to signal waveforms for transmission. The signal waveforms are transmitted via a transmit antenna (not shown) over the communication channel 105 to the receiver 103.

Figure 3:
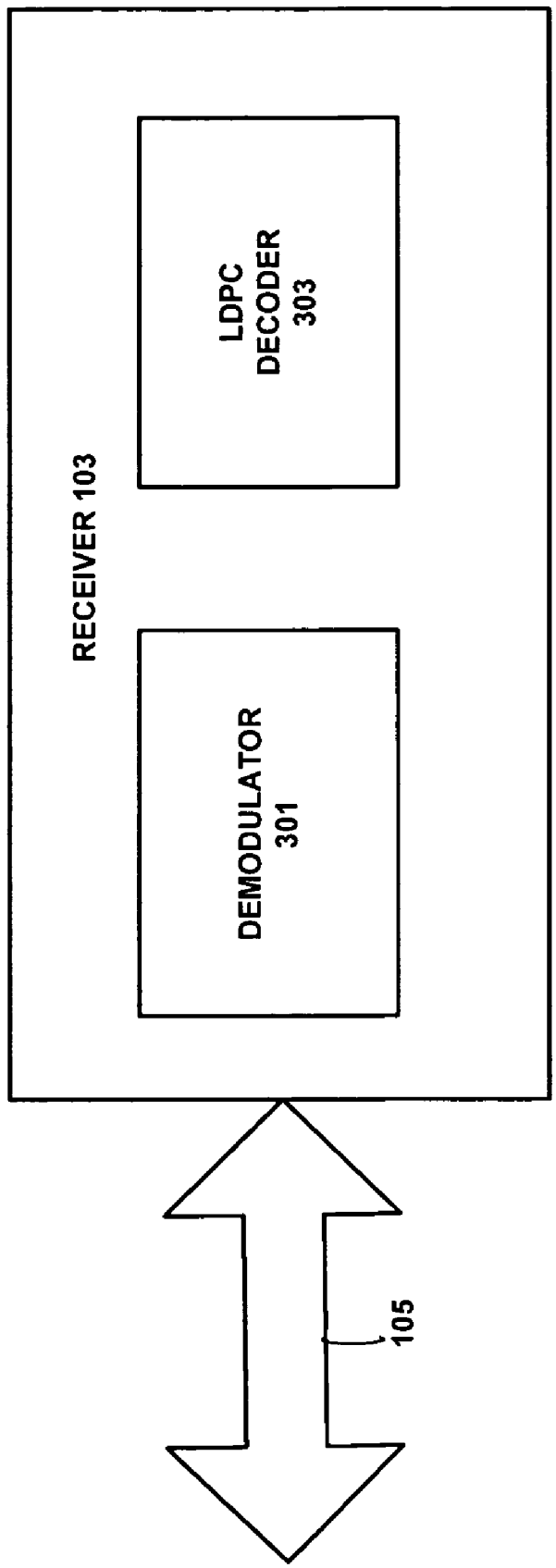
FIG. 3 is a receiver for correcting errors in a signal transmission using a rate ¾ LDPC code in accordance with an embodiment of the invention.

FIG. 3 is a receiver for correcting errors in a signal transmission using a rate ¾ LDPC code in accordance with an embodiment of the invention. In FIG. 3, the receiver 103 includes at least a demodulator 301 and an LDPC decoder 303. The demodulator 301 receives the signal transmission from an antenna (not shown). The demodulator 301 can be any electronic circuit device known in the art that is used to recover the information content from the carrier wave of a signal. The demodulated signal is then forwarded to the LDPC decoder 303.

The LDPC decoder 303 performs the reverse operation of the LDPC encoder 201; undoing the encoding so that the original data message or information can be retrieved. The same method used by the LDPC encoder 201 is usually just reversed. Specifically, the decoding is performed using a parity check matrix of ¾ LDPC code to obtain the data message.

In a preferred embodiment, the decoding is performed using a parity check matrix corresponding to an N=1944. Each entry in the parity check matrix represents an 81×81 submatrix that is either a right-circularly-shifted identity submatrix, or a zero submatrix represented by a dash. In the case of the former, the value of each entry is the number of times the columns of the identity submatrix are circularly-shifted to the right. As mentioned previously, the specification of the a parity check matrix are described in more detail in the discussion of FIGS. 4A-4C below.

FIGS. 4A-4C help to illustrate the specifications of the parity check matrix used for encoding and decoding a data message in accordance with an embodiment of the present invention. FIG. 4A is a sample M×M identity submatrix in which the center diagonal is represented by "1s." FIG. 4B is a sample M×M identity submatrix in which the columns are shifted to the right in a circular manner by 1. Finally, FIG. 4C is a sample M×M zero submatrix. In a preferred embodiment, M=81 for N=1944 codes. In another embodiment, M=54 for N=1296 codes. In still another embodiment, M=27 for N=648 codes. The following are the parity check matrices used for encoding and decoding data messages in the cases where N=1944, N=1296 and N=648:

Base Matrix for N=1944:

48 29 28 39 9 61 - - - 63 45 80 - - - 37 32 22 1 0 - - - - 4 49
 42 48 11 30 - - - 49 17 41 37 15 - 54 - - - 0 0 - - - 35 76
 78 51 37 35 21 - 17 64 - - - 59 7 - - 32 - - 0 0 - - 9 65 44
 9 54 56 73 34 42 - - - 35 - - - 46 39 0 - - 0 0 - 3 62 7 80 68
 26 - 80 55 - 36 - 26 - 9 - 72 - - - - - 0 0 26 75 33 21 69 59
 3 38 - - - 35 - 62 36 26 - - 1 - - - - 0.

Base Matrix for N=1296:

29 24 19 5 32 16 25 - - 32 - 53 - 35 32 38 - - 1 0 - - - - 8 19
 31 45 23 8 - - 4 35 20 - 0 19 4 - - - - 0 0 - - - 50 53 22 42
 51 38 - 42 - - 14 30 7 - 37 - 31 - - - 0 0 - - 46 5 38 10 50
 9 - - 38 - 16 25 - - - 14 34 6 0 - - 0 0 - 34 13 16 20 41 33
 25 53 - 36 - - 41 27 - - - 21 - - - - 0 0 39 22 53 49 25 53 22
 2 0 - - - - - - 23 7 0 1 - - - - 0.

Base Matrix for N=648:

5 25 18 15 23 10 13 8 - - - 7 16 - - - 24 1 0 - - - - 9 1 1 10
 2 23 15 - 11 - 2 - - - - - 6 12 2 - 0 0 - - - 21 26 17 6 13 5 -
 - - 12 7 14 20 - 25 - - 10 - - 0 0 - - 5 16 23 24 15 6 - - 22
 - 6 2 - 22 - 18 11 - 0 - - 0 0 - 23 23 11 17 23 19 - 15 4 18
 - - 1 - 5 7 - - - - - - 0 0 13 7 17 0 14 21 20 2 - 3 - - - 9 9 -
 13 - 1 - - - - 0.

In the parity check matrix for N=1944 noted above, each entry represents an 81×81 submatrix that is either a right-circularly-shifted identity submatrix, or a zero submatrix represented by a dash. In the case of the former, the value of the entry represents the number of times the columns of the identity submatrix are circularly-shifted to the right. For example, looking a the Base Matrix when N=1944, the first entry "48" represents an 81×81 identity submatrix, wherein the columns of the identity submatrix are circularly shifted to the right 48 times. Similarly, the second entry to the right "29" represents an 81×81 identity submatrix, wherein the columns of the identity submatrix are circularly shifted to the right 29 times. FIGS. 4A and 4B illustrate in more detail what is meant by "right-circularly-shifted." FIG. 4A is a sample M×M identity submatrix in which there is a center diagonal of all "1s" (i.e., not circularly-shifted to the right). As seen in FIG. 4B, the columns of the identity submatrix are shifted to the right in a circular manner by 1 position. In other words, the "1s" making-up the center diagonal begin at column 2, row 1, instead of column 1, row 1. Additionally, the "1" previously at column 4, row 4 has been circularly-shifted to column 1, row 4. As stated previously, the dashes in the party check matrix represent an 81×81 zero submatrix. FIG. 4C illustrates a sample M×M zero submatrix in accordance with the invention.

In a preferred embodiment, the parity check matrix corresponding to a code rate of ¾ and an N=1944 is implemented for communicating data messages in conformance with an 802.11n wireless standard. However, it is also contemplated that the parity check matrices can be implemented for communicating data messages in conformance with other wireless standards and other communication systems. Thus, it should be understood that any suitable entries and/or base matrices can be implemented for any suitable value of N.

Figure 5:
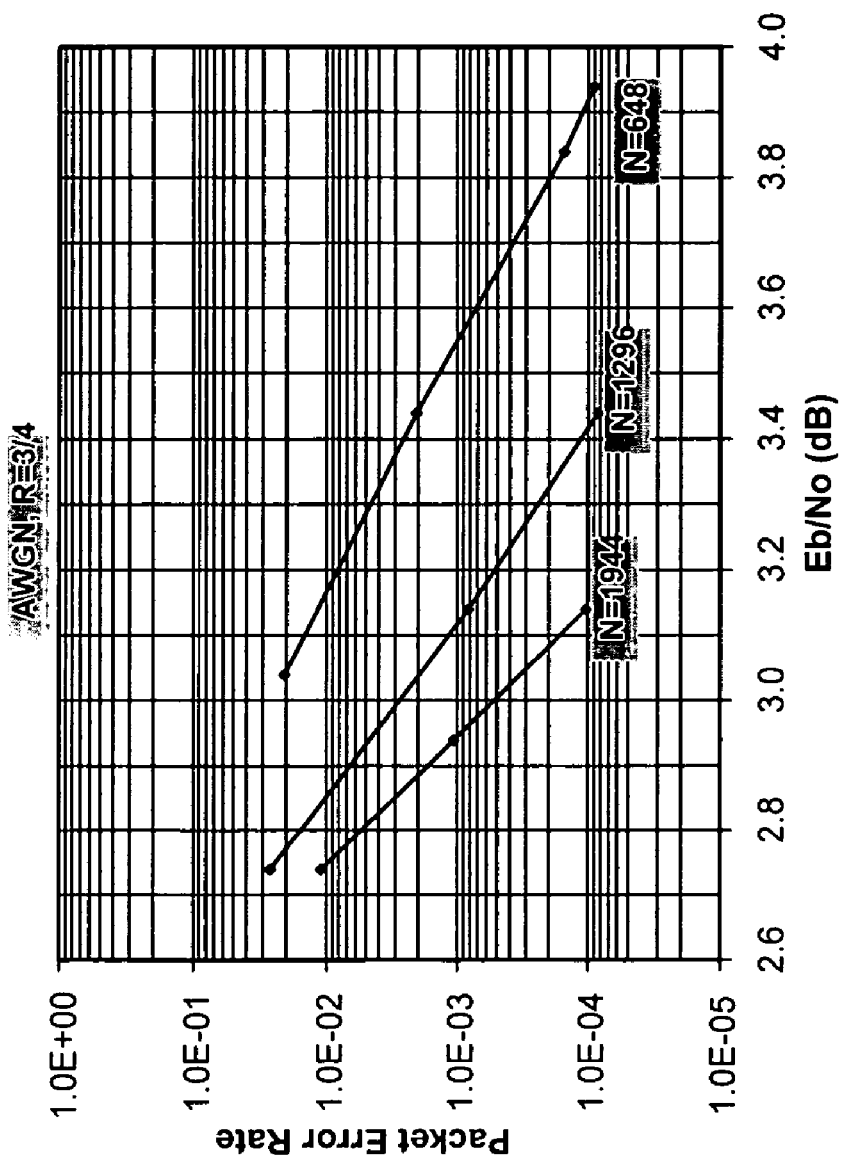
FIG. 5 is graph depicting the performance of three exemplary LDPC codes in accordance with various embodiments of the present invention.

FIG. 5 is graph depicting the performance of three exemplary LDPC codes in accordance with various embodiments of the present invention. In accordance with various embodiments of the present invention, Base Matrices of rate ¾ LDPC codes with coded block sizes N=1944, N=1296 and N=648 are presented below. The performance of the three exemplary LDPC codes are plotted with respect to Packet Error Rate verses signal-to-noise ratio (Eb/No). As stated, each entry in base matrix for N=1944 is an 81×81 submatrix that is either an identity submatrix with the columns are shifted to the right in a circular manner by an amount given by the entry in the base matrix or a zero submatrix. The rate ¾ LDPC codes can be used to detect errors in signals transmitted via a wireless or wired transmission, including but not limited to cellular or satellite transmissions.

LDPC codes are described in greater detail in W. E. Ryan, "An introduction to LDPC codes," in CRC Handbook for Coding and Signal Processing for Recoding Systems (B. Vasic, ed.), CRC Press, 2004; R. G. Gallager, "Low-density parity-check codes," IRE Trans. Inform. Theory, vol. 8, pp. 21-28, January, 1962; D. J. C. MacKay and R. M. Neal, "Near Shannon limit performance of low density parity check codes," IEE Electronics Letters, vol. 32, no. 18, pp. 1645-1655, 29 Aug. 1996; R. G. Gallager, Low-Density Parity-Check Codes, Cambridge, MA: M.I.T. Press, 1963; D. J. C. MacKay, "Good error-correcting codes based on very sparse matrices," IEEE Trans. Inform. Theory, vol. 45, pp. 399-431, March, 1999. errata; R. M. Tanner, "A recursive approach to low complexity codes," IEEE Trans. Inform. Theory, vol. 27, pp. 533-547, September, 1981; and M. P. C. Fossorier, "Iterative reliability-based decoding of low-density parity check codes," IEEE J. Select. Areas Commun., vol. 19, pp. 908-917, May, 2001, the contents of each of which are hereby incorporated by reference.

Figure 6:
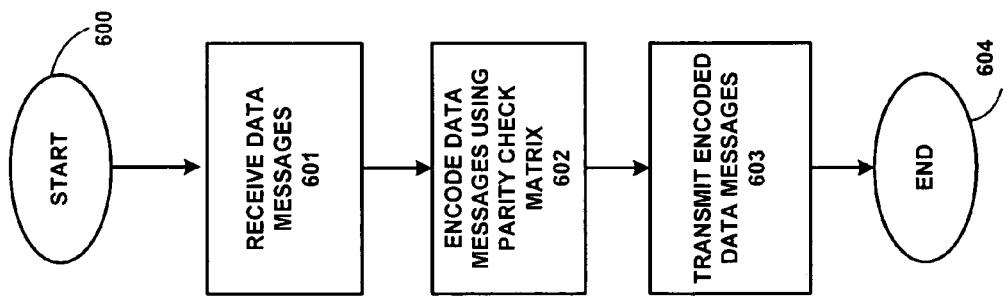
FIG. 6 is flow diagram for correcting errors in a signal transmission using a rate ¾ LDPC code in accordance with an embodiment of the invention.

FIG. 6 is flow diagram for correcting errors in a signal transmission using a rate ¾ LDPC code in accordance with an embodiment of the invention. In step 600, transmitter 101 is equipped with a source (not shown) that outputs a data message. In step 601, the LDPC encoder 201 receives the data message from the source and in step 602 encodes the data message. The data message is encoded using a parity check matrix of the rate ¾ LDPC code. In a preferred embodiment, the coded block size (N) is 1944, and the data messages are encoded for achieving a signal transmission in conformance with an 802.11n wireless standard.

However, the LDPC encoder 201 can be any device known in the art that is capable encoding a signal (such as a bitstream) or data into a form that is acceptable for transmission over the communication channel 105 using a programmed algorithm. Additionally, it is contemplated that data messages can be encoded for achieving a signal transmission in conformance with other wireless standards and other communication systems. In step 603, the modulator 203 maps the encoded data messages from encoder 201 to signal waveforms that are forwarded to a transmit antenna (not shown), which transmits the waveforms over the communication channel 105 to the receiver 103. At step 604, the transmission process of a particular data message or data messages ends after the signal is transmitted via the transmit antenna (not shown). In FIG. 6, for simplicity, the process is shown to end at step 604. However, it should be understood by one of ordinary skill in the art that in more practical applications the process in FIG. 6 is likely to be continuous. In other words, the transmitter 101 continuously processes and transmits data messages to the receiver 103 via the communication channel 105. Additionally, the method of the present invention also includes steps for performing data processing on a data message before or after encoding (but prior to transmission) such as repetition shortening, punctuating or the like.

Figure 7:
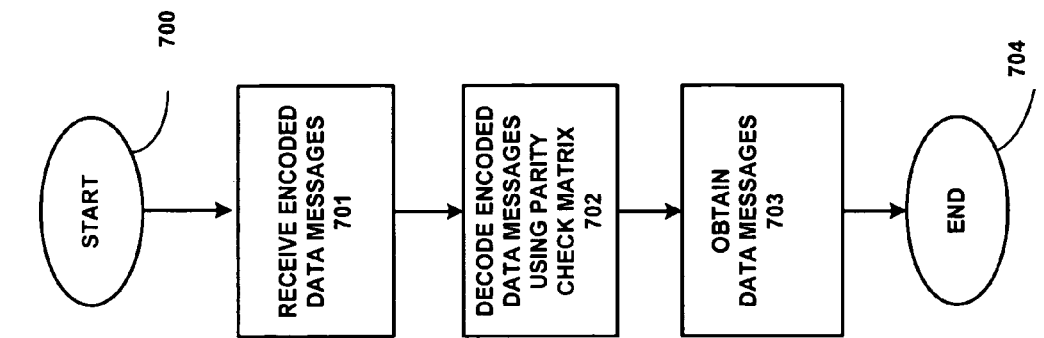
FIG. 7 is flow diagram for correcting errors in a signal transmission using a rate ¾ LDPC code in accordance with an embodiment of the invention.

FIG. 7 is flow diagram for correcting errors in a signal transmission using a rate ¾ LDPC code in accordance with an embodiment of the invention. More specifically, FIG. 7 illustrates a method of decoding data messages received from the transmitter 101. The receiver 103 includes at least a demodulator 301 and an LDPC decoder 303. At step 700, a signal transmission is successfully transmitted via the channel 105 to the receiver 103. At step 701, the signal transmission is received at the antenna (not shown) of the receiver 103. Next, the demodulator 301 receives and demodulates the signal transmission from the antenna. The demodulator 301 can be any electronic circuit device known in the art that is used to recover the information content from the carrier wave of a signal. The demodulated signal is then forwarded to the LDPC decoder 303.

In step 702, the LDPC decoder 303 performs the reverse operation of the LDPC encoder 201; undoing the encoding so that the original data message or information can be retrieved. The decoding is performed using a parity check matrix of the rate ¾ LDPC code. In a preferred embodiment, the decoding is performed using a parity check matrix corresponding to a code rate of ¾ and an N=1944. Once the decoding is complete, the data message is obtained and the decoding process for a particular data message or data messages ends at step 704. In FIG. 7, for simplicity, the process is shown to end at step 704. However, it should be understood by one of ordinary skill in the art that in more practical applications the process in FIG. 7 is likely to be continuous. In other words, the receiver 103 continuously receives and processes data messages received from the transmitter 101 via the communication channel 105.

Figure 8:
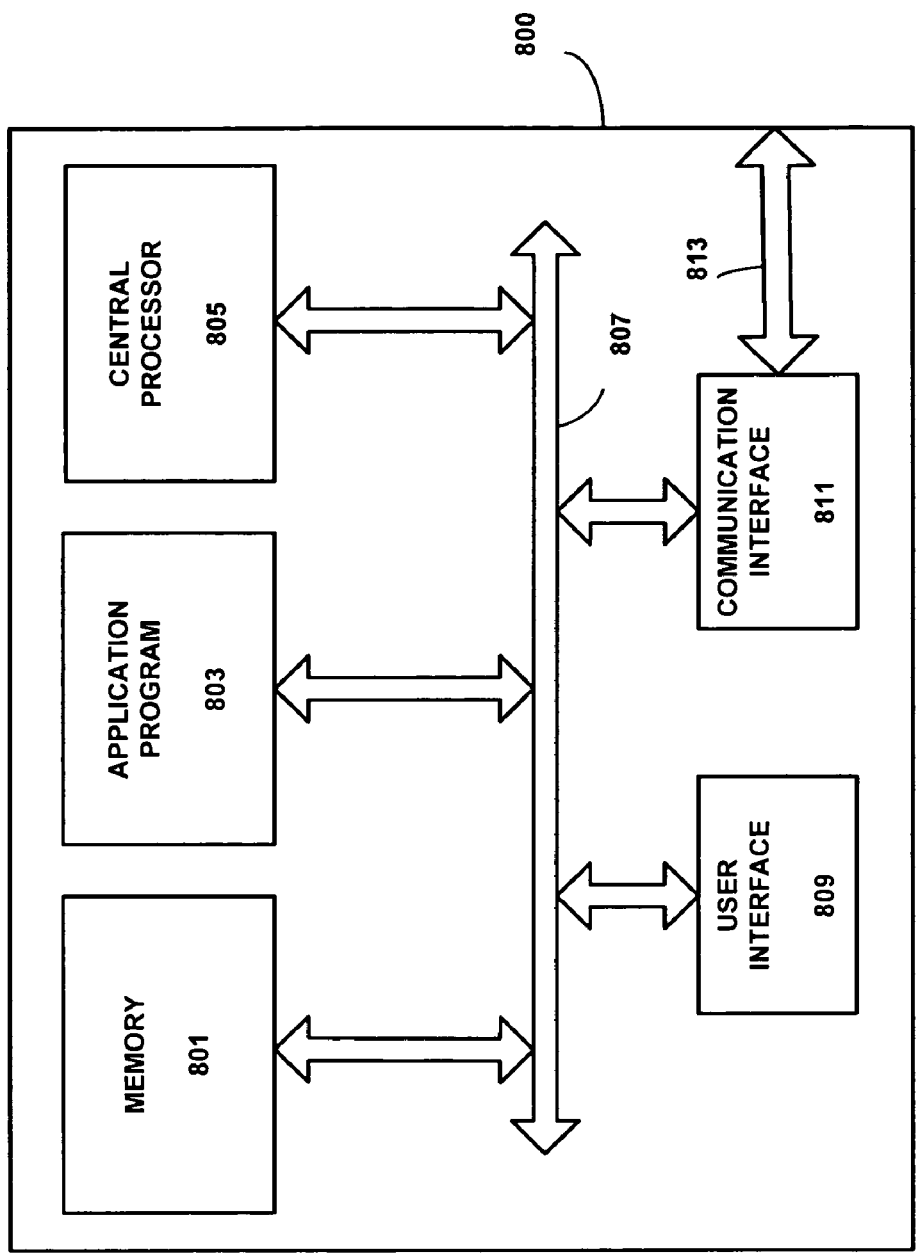
FIG. 8 is a computer-program product for correcting errors in a signal transmission using a rate ¾ LDPC code in accordance with an embodiment of the invention.

FIG. 8 is a representative computer system for correcting errors in a signal transmission using a rate ¾ LDPC code in accordance with an embodiment of the invention. In FIG. 8, the computer system 800 includes a memory 801, application program 803, central processor 805, central bus 807, user interface 809 and communication interface 811. The memory 801 can be computer-readable media used to store executable instructions or code thereon. The term "computer program product" as used herein is intended to encompass a computer program that exists permanently or temporarily on any computer-readable medium. The memory 801 can be ROM, RAM, PROM, EPROM, smart card, SIMs, WIMs or any other medium from which a computing device can read executable instructions or code.

The executable instructions stored in the memory 801 are executable by one or more processors 805, which is facilitated by the application program 803. The application program 803 can be an operating system or any special computer program that manages the relationship between application software and any suitable variety of hardware known in the art that helps to make-up a computer system or computing environment. The executable instructions in the memory 801 include instructions for performing the encoding and decoding of a data message using a parity check matrix of rate ¾ LDPC code. Additionally, the executable instructions in the memory 801 also include instructions for performing data processing operations before and after encoding such as repetition, puncturing, shortening or the like. In a preferred embodiment, the data messages are encoded and decoded using a parity check matrix corresponding to a coded block size (N) of 1944. This parity check matrix can be implemented for achieving a signal transmission in conformance with an 802.11n wireless standard. Although, it is contemplated that data messages can be encoded and decoded for achieving a signal transmission in conformance with other wireless standards and other communication systems.

The computer system 800 also includes a communication interface 811 coupled to a bus 807. The communication interface 811 provides for two-way data communications. For example, the communication interface 811 may be a digital subscriber line (DSL) card or modem, an integrated services digital network (ISDN) card, a cable modem, or a telephone modem to provide a data communication connection to a corresponding type of telephone line. As another example, communication interface 811 may be a local area network (LAN) card (e.g., for Ethernet™ or an Asynchronous Transfer Model (ATM) network) to provide a data communication connection to a compatible LAN. Further, the communication interface 811 can include peripheral interface devices, such as a Universal Serial Bus (USB) interface, a PCMCIA (Personal Computer Memory Card International Association) interface, and the like. The computer system 800 can send and receive data through the network link 813, and communication interface 811. Finally, a user interface 809 is also include. The user interface 809 can include any means by which a user can interact with the computer system 800. It should be understood by one or ordinary skill in the art that the user interface can include any suitable means known in the art for input by (i.e., allowing the users to input data and control the computer system 800) and output to (i.e., allowing the user to receive data and other information from the computer system 800) a user.

The computer system 800 can be implemented in the LDPC encoder 201 and LDPC decoder 303 for carrying out the features of the apparatuses and methods of the invention as disclosed. In the alternative, the computer system 800 can be implemented in any suitable computing device know in the art that is configured in communication with the LDPC encoder 201 and LDPC decoder 303 for carrying out the features of the apparatuses and methods of the invention as disclosed. From the description of the computer system 800, those skilled in the art should be readily able to combine software created as described with appropriate general purpose or special purpose computing hardware for carrying out the features of the invention.

Additionally, it should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for correcting errors in a signal transmission using a rate ¾ low density parity check (LDPC) code, comprising:
    encoding at least a portion of a received data message using a parity check matrix of the LDPC code;
    transmitting at least a portion of the encoded data message in a signal transmission over a communication channel; and
    receiving the signal transmission and decoding the encoded portion of the data message using a parity check matrix of the LDPC code; and
    wherein the encoding and decoding are performed using a parity check matrix corresponding to a coded block size (N) equal to 1944, a representation of the parity check matrix comprising:
    48 29 28 39 9 61 - - - 63 45 80 - - - 37 32 22 1 0 - - - - 4 49
    42 48 11 30 - - - 49 17 41 37 15 - 54 - - - 0 0 - - - 35 76
    78 51 37 35 21 - 17 64 - - - 59 7 - - 32 - - 0 0 - - 9 65
    44 9 54 56 73 34 42 - - - 35 - - - 46 39 0 - - 0 0 - 3 62
    7 80 68 26 - 80 55 - 36 - 26 - 9 - 72 - - - - - 0 0 26 75 33
    21 69 59 3 38 - - - 35 - 62 36 26 - - 1 - - - - 0.

2. The method of claim 1, wherein each entry in the representation of the parity check matrix is an 81×81 submatrix.

3. The method of claim 2, wherein at least one entry in the representation of the parity check matrix is a right-circularly-shifted identity submatrix, wherein the value of the entry represents the number of times all the columns of the identity submatrix are circularly-shifted to the right.

4. The method of claim 2, wherein at least one entry in the representation of the parity check matrix is a zero submatrix represented by a dash.

5. The method of claim 1, wherein the parity check matrix is implemented for communicating data messages in conformance with an 802.11n wireless standard.

6. The method of claim 1, further comprising performing a data processing operation on the data message before or after encoding that includes at least one of a repetition, shortening or puncturing operation.

7. A method of communicating data messages between a receiver and a transmitter in a communication network using a rate ¾ low density parity check (LDPC) code, comprising:
    encoding at least a portion of a received data message using a parity check matrix of the LDPC code;
    transmitting from the transmitter at least a portion of the encoded data message in a signal transmission over a communication channel;
    receiving the signal transmission at the receiver; and
    decoding the encoded portion of the data message using a parity check matrix of the LDPC code,
    wherein the encoding and decoding are performed using a parity check matrix corresponding to a coded block size (N) equal to 1944, a representation of the parity check matrix being
    48 29 28 39 9 61 - - - 63 45 80 - - - 37 32 22 1 0 - - - - 4 49
    42 48 11 30 - - - 49 17 41 37 15 - 54 - - - 0 0 - - - 35 76
    78 51 37 35 21 - 17 64 - - - 59 7 - - 32 - - 0 0 - - 9 65
    44 9 54 56 73 34 42 - - - 35 - - - 46 39 0 - - 0 0 - 3 62
    7 80 68 26 - 80 55 - 36 - 26 - 9 - 72 - - - - - 0 0 26 75 33
    21 69 59 3 38 - - - 35 - 62 36 26 - - 1 - - - - 0.
    and each entry in the representation of the panty check matrix being an 81×81 submatrix that is either a right-circularly-shifted identity submatrix or a zero submatrix.

8. The method of claim 7, wherein at least one entry in the representation of parity check matrix has a value that represents the number of times all the columns of the identity submatrix are circularly-shifted to the right.

9. The method of claim 7, wherein at least one entry in the representation of the parity check matrix is a dash representing the zero submatrix.

10. The method of claim 7, wherein the parity check matrix is implemented for communicating data messages in conformance with an 802.11n wireless standard.

11. The method of claim 7, further comprising performing a data processing operation on the data message before or after encoding that includes at least one of a repetition, shortening or puncturing operation.

12. A system for correcting errors in a signal transmission using a rate ¾ low density parity check (LDPC) code, comprising:
- a transmitter encoding at least a portion of a received data message using a parity check matrix of the LDPC code and transmitting the encoded data message as a signal transmission;
- a communication channel for communicating the signal transmission from the transmitter through a communication network; and
- a receiver receiving the signal transmission and decoding the encoded portion of the data message using a parity check matrix of the LDPC code to obtain the data message; and
- wherein the encoding and decoding are performed using a parity check matrix corresponding to a coded block size (N) equal to 1944, a representation of the parity check matrix comprising:

48 29 28 39 9 61 - - - 63 45 80 - - - 37 32 22 1 0 - - -- 4 49
42 48 11 30 - - - 49 17 41 37 15 - 54 - - - 0 0 - - - 35 76
78 51 37 35 21 - 17 64 - - - 59 7 - - 32 - - 0 0 - - 9 65
44 9 54 56 73 34 42 - - - 35 - - - 46 39 0 - - 0 0 - 3 62
7 80 68 26 - 80 55 - 36 - 26 - 9 - 72 - - - - - 0 0 26 75 33
21 69 59 3 38 - - - 35 - 62 36 26 - - 1 - -- - 0.

13. The system of claim 12, wherein each entry of the parity check matrix is an 81×81 submatrix.

14. The system of claim 12, wherein at least one entry in the representation of parity check matrix is a right-circularly-shifted identity submatrix, wherein the value of the entry represents the number of times all the columns of the submatrix are circularly-shifted to the right.

15. The system of claim 12, wherein at least one entry in the representation of the parity check matrix is a zero submatrix represented by a dash.

16. The system of claim 12, wherein the parity check matrix is implemented by the transmitter and receiver for communicating data messages in conformance with an 802.11n wireless standard.

17. The system of claim 12, further comprising a data processing unit performing a data processing operation on the data message before or after encoding that includes at least one of a repetition, shortening or puncturing operation.

18. A encoding device for correcting errors in a signal transmission using a rate ¾ low density parity check (LDPC) code, comprising:
- means for encoding at least a portion of a received data message using a parity check matrix of the LDPC; and
- means for transmitting from a transmitter at least a portion of the encoded data message in a signal transmission over a communication channel to a receiving device; and
- wherein the encoding is performed using a parity check matrix corresponding to a coded block size (N) equal to 1944, a representation of the parity check matrix comprising:

48 29 28 39 9 61 - - - 63 45 80 - - - 37 32 22 1 0 - -- - 4 49
42 48 11 30 - - - 49 17 41 37 15 - 54 - - - 0 0 - - - 35 76
78 51 37 35 21 - 17 64 - - - 59 7 - - 32 - - 0 0 - - 9 65
44 9 54 56 73 34 42 - - - 35 - - - 46 39 0 - - 0 0 - 3 62
7 80 68 26 - 80 55 - 36 - 26 - 9 - 72 - - - - - 0 0 26 75 33
21 69 59 3 38 - - - 35 - 62 36 26 - - 1 - - - - 0, and each entry in the representation of the parity check matrix representing an 81×81 submatrix with at least one entry representing a right-circularly-shifted identity submatrix, the value being the number of times all the columns of the identity submatrix are circularly-shifted to the right, and with at least one entry being a dash representing a zero matrix.

19. The encoding device of claim 18, wherein the parity check matrix is implemented for communicating data messages in conformance with an 802.11n wireless standard.

20. A decoding device for correcting errors in a signal transmission using a rate ¾ low density parity check (LDPC) code, comprising:
- means for receiving a signal transmission via a communication channel; and
- means for decoding an encoded portion of a data message using a parity check matrix of the LDPC code; and
- wherein the decoding is performed using a parity check matrix corresponding to a coded block size (N) equal to 1944, a representation of the parity check matrix comprising:

48 29 28 39 9 61 - - - 63 45 80 - - - 37 32 22 1 0 - -- - 4 49
42 48 11 30 - - - 49 17 41 37 15 - 54 - - - 0 0 - - - 35 76
78 51 37 35 21 - 17 64 - - - 59 7 - - 32 - - 0 0 - - 9 65
44 9 54 56 73 34 42 - - - 35 - - - 46 39 0 - - 0 0 - 3 62
7 80 68 26 - 80 55 - 36 - 26 - 9 - 72 - - - - - 0 0 26 75 33
21 69 59 3 38 - - - 35 - 62 36 26 - - 1 - - - - 0, and each entry of the parity check matrix representing an 81×81 submatrix with at least one entry representing a right-circularly-shifted identity submatrix, the value being the number of times all the columns of the identity submatrix are circularly-shifted to the right, and at least one entry being a dash representing a zero matrix.

21. The decoding device of claim 20, wherein the parity check matrix is implemented for communicating data messages in conformance with an 802.11n wireless standard.

* * * * *